United States Patent [19]

Gunderson et al.

[11] Patent Number: 5,691,592
[45] Date of Patent: Nov. 25, 1997

[54] ACTUATOR DRIVE AND ENERGY RECOVERY SYSTEM

[75] Inventors: Mark D. Gunderson, Gurnee; George T. Maly, Freeport, both of Ill.

[73] Assignee: Motorola, Inc., Schaumburg, Ill.

[21] Appl. No.: 528,034

[22] Filed: Sep. 14, 1995

[51] Int. Cl.⁶ .................................................. H01L 41/09
[52] U.S. Cl. ............................................................. 310/317
[58] Field of Search ................................. 310/316, 317, 310/319

[56] References Cited

U.S. PATENT DOCUMENTS

| | | | |
|---|---|---|---|
| 3,551,764 | 12/1970 | Evans | 318/116 |
| 3,978,393 | 8/1976 | Wisner et al. | 323/23 |
| 4,258,282 | 3/1981 | Rijckaert | 310/317 |
| 4,479,175 | 10/1984 | Gille et al. | 363/41 |
| 4,644,212 | 2/1987 | Moritugu et al. | 310/317 |
| 4,705,003 | 11/1987 | Sakakibara et al. | 123/449 |
| 4,939,402 | 7/1990 | Hirayama et al. | 310/316 |
| 4,947,074 | 8/1990 | Suzuki | 310/316 |
| 5,036,263 | 7/1991 | Yamada et al. | 318/116 |
| 5,095,256 | 3/1992 | Ueyama et al. | 318/116 |
| 5,130,598 | 7/1992 | Verheyen et al. | 310/316 |
| 5,214,340 | 5/1993 | Suzuki | 310/316 |
| 5,245,242 | 9/1993 | Hall | 310/316 |
| 5,260,864 | 11/1993 | Simonelli et al. | 363/143 |
| 5,264,752 | 11/1993 | Savicki | 310/316 |
| 5,350,962 | 9/1994 | Sakaida et al. | 310/316 |
| 5,387,834 | 2/1995 | Suzuki | 310/317 |

*Primary Examiner*—Thomas M. Dougherty
*Attorney, Agent, or Firm*—Michael L. Smith

[57] ABSTRACT

An actuator drive and energy recovery system (50) includes a power supply (52), a charge switching element (58), a recovery switching element (60), a resonating inductor (64) for increasing a voltage supplied to a load (66) thereby providing a single path through the single inductor (64) for charging and recovering energy between the power supply (52) and the load (66).

12 Claims, 2 Drawing Sheets

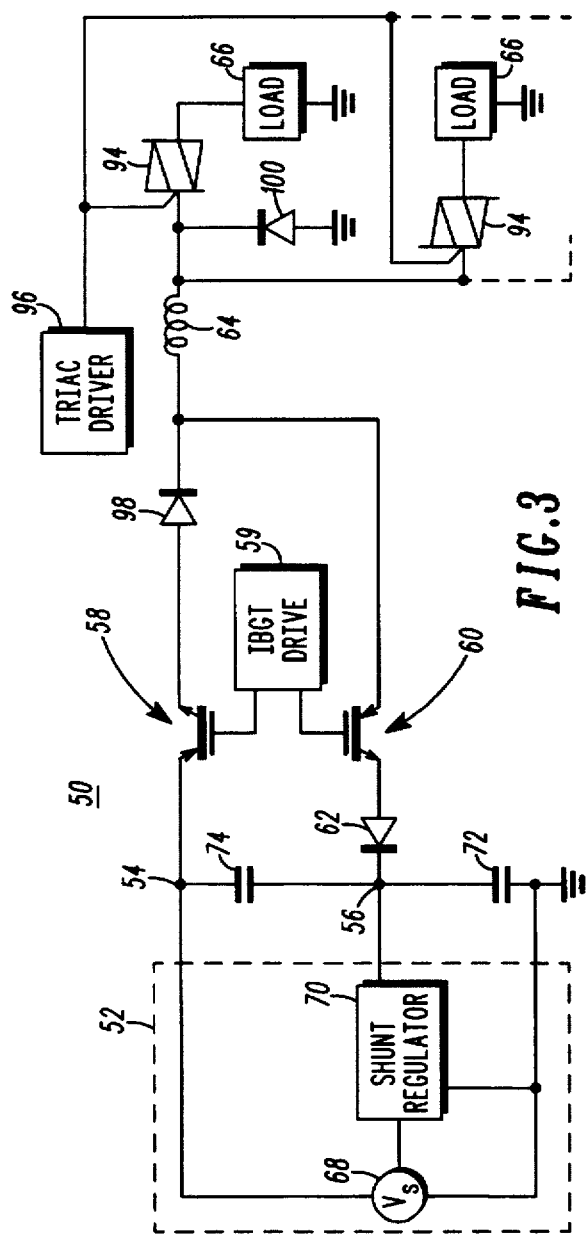
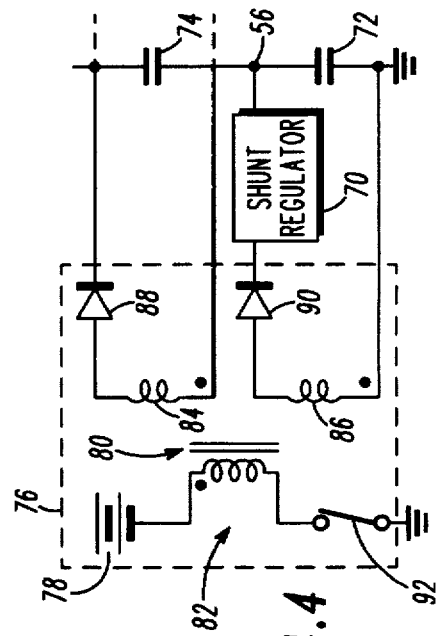

ACTUATOR DRIVE AND ENERGY RECOVERY SYSTEM

FIELD OF THE INVENTION

This invention is generally directed to the field of actuator drive circuits, and specifically for an actuator drive circuit providing a single path for charging and recovering energy between the power supply and the load.

BACKGROUND OF THE INVENTION

Using a piezoelectric actuator to convert electric power into mechanical power is very well known. A typical use for such actuators is to control the fuel injection valves in an internal combustion engine. As described in U.S. Pat. No. 5,130,598 ("the '598 patent") to Verheyen et al., the use of a piezoelectric actuator is preferred because of its faster response than a conventional electromagnetic solenoid. Using a six cylinder engine as an example, without the use of energy recovery a relatively large and cumbersome power supply would be required. With the use of energy recovery the power source requirements drop dramatically because it is possible to recover significantly more than 50% of the energy from the actuators. This allows for the use of a significantly smaller sized power supply. This is important because in an engine the amount of space available for associated parts is always severely limited. Therefore, the ability to use a smaller sized power supply is an obvious advantage. In addition, particularly in a harsh engine environment, as the power and size requirements of the power supply increase the cost increases and the reliability decreases.

Contemporary circuits for charging and discharging large capacitive loads typically are found in one of two configurations. The first is commonly referred to as a resonant doubler. A typical resonant doubler used in an application where energy recovery is desirable requires the use of essentially two circuits—one circuit for charging the load and a second circuit for recovering energy from the load discharged. The resonant doubler then requires the use of two inductors that can be expensive and large due to the typically high voltage requirements of the engine's piezoelectric actuators. The second circuit typically used is referred to as a buck/boost actuator drive. While the buck/boost configuration only requires one inductor for both charging and energy recovery it also requires the use of a voltage source having the same voltage as that required by the load, which can be very large in automotive applications (~800 volts). The need for such a large voltage source consumes any space and money savings that may have been realized by using only a single inductor for both charging and energy recovery. The need for a large voltage source also raises concerns regarding cost and reliability of the circuit. Because the buck/boost requires constant current charging, switching losses and high frequency radiation tends to be greater than that of the resonant doubler circuit and therefore not as efficient for recovering energy.

FIG. 1, taken from the '598 patent, shows a simple actuator driver 10 for driving one load 12. The driver 10 includes a voltage source 14, a charging capacitor 16, a discharge capacitor 18, a charging inductor 20, a discharge inductor 22, a charging thyristor 24, a discharge thyristor 26, a clamping diode 28, and the load 12 is a piezoelectric actuator. When the charging thyristor 24 is turned ON a resonant circuit is formed between the charging inductor 20 and the actuator 12. This resonant circuit approximately doubles the level of the supply voltage and this voltage is used to activate or drive the actuator 12. As those skilled in the art are aware, when the load is fully charged, the resonated voltage level must be maintained. This is done by disconnecting the resonant circuit with the thyristor 24 in order to maintain the now doubled voltage level. When the discharge thyristor 26 is turned ON the actuator 12 is discharged through discharge inductor 22 and the energy is recovered in discharge capacitor 18. As stated above the use of this circuit has several disadvantages including the need for two inductors, which in order to handle the large voltage values required, will be large, expensive, or both. These inductors 20, 22 take up valuable space and are expensive.

FIG. 2, as shown and described in the '598 patent, shows another version for driving one load. An actuator driver 30 drives an actuator 32 by a constant current method. During charging a switch 34, an intrinsic diode 36 of a second switch 38, and an inductor 40 form a buck converter. By sensing current flowing through the actuator 32 an electronic control module 42 pulse width modulates the switch 34 to cause charging circuitry 43 to charge the voltage of the actuator 32 to the level of the voltage source 44. During discharge the second switch 38 and the intrinsic diode 46 of switch 34 together form a boost converter. By sensing the current across the actuator 32 the electronic control module 42 pulse width modulates the switch 38 to cause discharging circuitry 48 to discharge the voltage on the actuator. This actuator driver 30 has the disadvantage of requiring a voltage source 44 having the same voltage needed by actuator 32, which tends to be a very high voltage. The requirement of a large voltage source adversely impacts the cost and reliability of the circuit. In addition, because of the greater switching losses and high frequency radiation referred to above the energy recovery efficiency of the buck/boost circuit is not as great as with the resonant doubler. Therefore, any advantage gained by eliminating one inductor and a capacitor as compared with FIG. 1 has been largely lost by requiring the high voltage source 44.

It is noted that both of the above prior art schemes are only capable of driving a single load. Therefore, duplicate drive circuits must be included for each actuator to be driven or at lease significant additional circuitry.

What is needed is an improved actuator drive system that has the advantage of requiring only one inductor for both charging and discharging and can be driven by a voltage source that is significantly less than the voltage required by the actuator. Because any engine has several actuators to be driven, it would also be desirable to have an actuator drive circuit that can selectively drive multiple loads.

In other words, it would be desirable to have an actuator drive system that combines the best of the resonant doubler and buck/boost circuits by having a lower voltage power supply, a single charge and discharge path, low switching losses, plus the ability to efficiently drive multiple loads.

BRIEF DESCRIPTION OF THE DRAWINGS

For a more complete understanding of the present invention reference should be made to the drawings, where:

FIG. 3 is an actuator drive circuit in accordance with a preferred embodiment of the present invention; and FIG. 4 is an embodiment of a voltage source in accordance with the present invention.

DETAILED DESCRIPTION OF A PREFERRED EMBODIMENT

Figure 1:
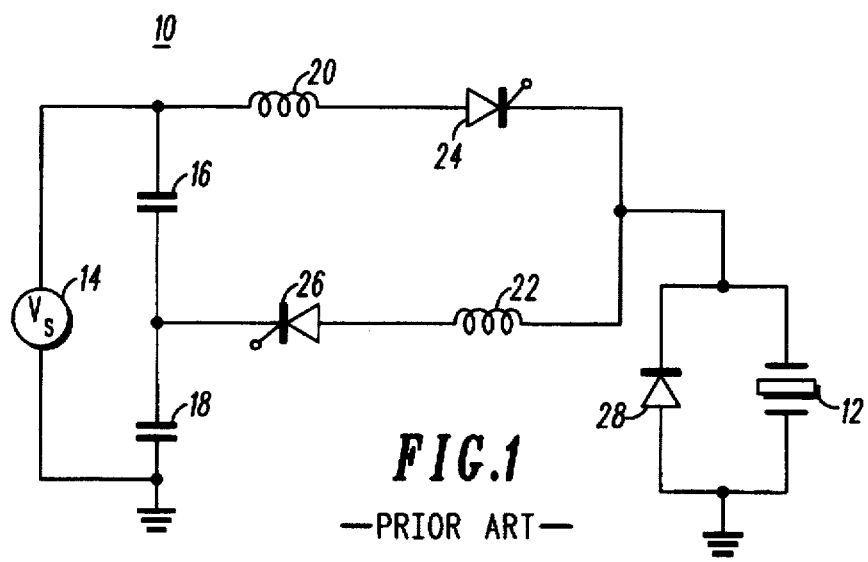
FIG. 1 is a prior art actuator drive circuit.
Figure 2:
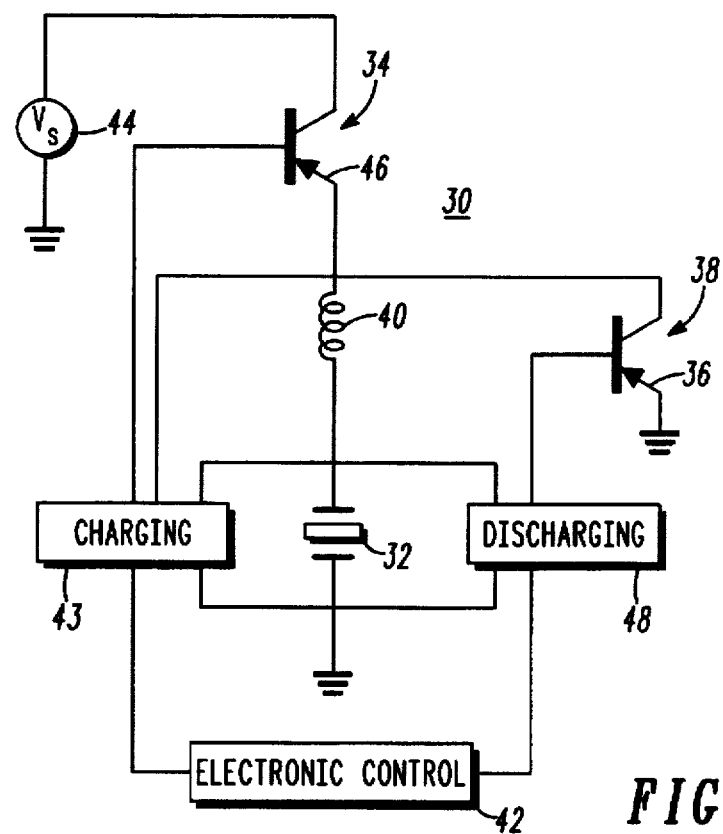
FIG. 2 is another prior art actuator drive circuit.

An actuator drive and energy recovery system 50 is shown in FIG. 3. The system 50 includes a power supply 52 presenting at least first and second serially interconnected output terminals 54, 56, a charge switching element 58 connected to the first output terminal 54, a recovery switching element 60 connected to the second output terminal 56 through blocking diode 62, a resonating inductor 64 connected between both the charge and recovery switching elements 58, 60, a drive circuit 59, and a load 66 for increasing a voltage, based on the resonant doubler concept, supplied to the load 66 thereby providing a single path through the single inductor 64 for charging and recovering energy between the power supply 52 and the load 66.

The present invention will be described in connection with the control of piezoelectric actuators as the loads 66. However, those skilled in the art will appreciate that the present invention could be used at other voltage levels depending on the requirements of the particular application. Also, the loads 66 could be capacitive rather than piezo. These actuators, typically, are used for the control of valves in the fuel injection systems of internal combustion engines. These loads 66 require a relatively high drive voltage on the order of approximately 800 volts.

The power supply 52 of system 50 could be of several configurations. This would include a voltage source 68 that supplies a voltage of about 400 volts and by resonating the voltage with the inductor 64 the required voltage can be supplied to a load 66.

Power supply 52 also preferably includes a recovery energy regulator (RER) 70, which is preferably a shunt regulator or an active regulator (to account for small differences in loads 66), operably coupled to the second output terminal 56 for maximizing energy recovery from the load 66. The RER 70 regulates the discharge or energy recovery voltage across capacitor 72 to a predetermined level. The use of RER 70 has at least three distinct advantages.

The first advantage is that the efficiency of the system 50 is improved by ensuring that the load voltage resonates down to zero volts. This allows the maximum amount of energy to be returned back to the power supply. That is to say that the use of RER 70 allows the voltage supply 52 to maintain an optimum voltage level to ensure that the load fully discharges. Without RER 70 the return voltage may increase, which will not allow the load to fully discharge and therefore not allow the maximum energy to be recovered.

The second advantage is that by properly regulating the voltage across capacitor 72 the voltage across load 66 can be completely discharged.

The third advantage is that by maintaining some predetermined voltage across capacitor 72 the step from an automobile's battery to the voltage necessary across capacitor 74 will be much less. For example, if power supply 52 needs to supply 400 volts to inductor 64 in order to produce 800 volts to loads 66, if RER 70 maintains a voltage of 260 volts then a transformer that steps up the voltage from the battery voltage to 140 volts will be all that is needed. This step up requires a much less expensive and smaller sized transformer than if a step up to 400 volts would be necessary. The level of voltage to be maintained by RER 70 across capacitor 72 depends on the amount of energy lost in the drive circuit and loads 66 during charging and discharging. The power supply 52 then is configured to provide the energy necessary to replace the amount of lost energy. The need to only supply energy to capacitor 74 is because energy lost across capacitor 72 is recovered by system 50 during discharge.

FIG. 4 discloses an alternate embodiment of voltage source 68 and is contained within dashed line 76. Power supply 76 includes the vehicle's battery 78 connected to a transformer 80 that includes a single primary winding 82 and two secondary windings 84 and 86. The windings 84 and 86 includes diodes 88 and 90, respectively for rectification of the output. In addition, power supply 76 includes a switch 92 for storing and dumping energy from the primary winding 82 to the secondary windings 84, 86. The secondary winding 86 aides in charging capacitor 72 during start up of the engine and is a source to ensure that RER 70 maintains a predetermined voltage level. This is because if the voltage level drops too low the system 50 will unnecessarily dump energy into diode 100 and thereby decrease the system 50 efficiency. As explained above if winding 86 can maintain a voltage of 260 volts then winding 84 needs to only step up the battery 78's voltage to 140 volts rather than the full 400 volts needed by the inductor 64.

Referring to FIG. 3, elements 58 and 60 are preferably insulated gate bipolar transistors (IGBTs) in order accommodate voltage requirements and to provide reliable shutoff and to protect the circuit when short circuits occur. In operation, when charge switching element 58 is turned ON the inductor 64 resonates with the load 66, in this example, to 800 volts and depending upon which bi-directional switching element or triac device 94 is enabled by triac driver 96 a particular load 66 is charged. Obviously, in operation system 50 will need to selectively drive actuators or loads 66 for each cylinder in the engine. Typically in the prior art, when driving multiple loads two switches for each load are required. One switch is needed for charging and another for discharging. These switches have typically been SCRs or similar switching devices in order to provide adequate switching speed and a dv/dt rating. The triac devices 94 have not been used in the prior art for switching between multiple loads because they were thought not to provide the switching speeds and dv/dt ratings required. Even though these concerns are generally valid for triacs 94, in the above described internal combustion engine applications the concerns have been overcome. They provide the distinct advantage of only needing one device per load for charging and discharging. The triac devices 94 are preferably snubberless triacs available from SGS Thompson, part no. BTB12. The use of these triac devices provides the significant advantage of eliminating the need for much additional expensive circuitry, such as the use of 2 SCRs with control circuitry for each load to be driven.

As those skilled in the art will appreciate, any well known current sense scheme is sufficient to control the switching of the IGBTs 58, 60 and triacs 94 for normal operation and fault conditions. It is also noted that a reset clamp (not shown), for the inductor 64 may be desirable under a short circuit condition to prevent saturation of inductor 64. It is noted that blocking diodes 62 and 98 are preferably included to provide reverse voltage protection to the IGBTs 58 and 60 and diode 100 operates to clamp the load 66 voltage to zero during discharge.

In conclusion, this system 50 provides a cheaper, smaller, more efficient actuator driver than has previously been available. By providing an actuator driver system 50 that requires only one inductor to charge and discharge a load 66, unlike the requirements of the prior art resonant doubler, and not require a higher voltage and less reliable power supply, relative to the prior art buck/boost circuit, a significant advantage has been realized. In addition, the present invention provides an inexpensive efficient scheme for driving multiple loads. In other words, system 50 provides the advantages of having a lower voltage power supply, a single charge and discharge path, low switching losses, plus the ability to efficiently drive multiple loads.

What is claimed is:

1. An Actuator drive and energy recovery system comprising:
   a power supply presenting at least first and second serially interconnected output terminals and a grounded terminal;
   a charge switching element connected to the first output terminal;
   a recovery switching element connected to the second output terminal; and
   a resonating inductor connected between both the charge and recovery switching elements and a load for increasing a voltage supplied to the load above a voltage supplied by the power supply thereby providing a single path for charging and recovering energy between the power supply and the load.

2. The system of claim 1, the power supply further including a recovery energy regulator (RER) operably coupled to the second output terminal for maximizing energy recovery from a capacitive load.

3. The system of claim 2 wherein the RER includes a shunt regulator.

4. The system of claim 1 wherein the power supply is a switching regulator including a transformer having output power windings connected across the first and second output terminals for decreasing step-up requirements of the transformer.

5. The system of claim 4 wherein the power supply further includes a secondary winding operably coupled to the second output terminal during start up of the power supply.

6. The system of claim 1 wherein the charge and recovery switching elements are insulated gate bipolar transistors.

7. The system of claim 1 wherein the load is piezo.

8. The system of claim 1 wherein multiple capacitive loads are to be independently driven, the system further including a bi-directional switching element interconnected between each capacitive load and the resonating inductor for selectively enabling each capacitive load and to provide a single switch for both charging each capacitive load and recovering energy from each capacitive load.

9. The system of claim 8 wherein the bi-directional switching element is a triac device.

10. An actuator drive and energy recovery system for selectively driving and recovering energy from multiple loads, the system comprising:
    charge means for charging multiple loads;
    energy recovery means operably coupled to the charge means and the loads;
    resonating means operably coupled to the charge and energy recovery means and the loads for increasing a voltage supplied to the loads above a voltage supplied by the charge means and recovering energy from the loads; and
    bi-directional switching means interconnected between each load and the resonating means for selectively enabling each load and to provide a single switch for both charging each load and recovering energy from each load.

11. An actuator drive and energy recovery circuit comprising:
    power supply means presenting first and second interconnected output terminals and a grounded terminal;
    charge switching means connected to the first output terminal;
    recovery switching means connected to the second output terminal; and
    resonating means connected between both the charge and recovery switching means and a load for increasing a voltage supplied to the load above a voltage supplied by the power supply means and providing a single path for charging and recoverying energy between the power supply and the capacitive load.

12. An actuator drive and energy recovery system for driving and recovering energy from multiple capacitive loads, the system comprising:
    a power supply presenting at least first and second serially interconnected output terminals and a grounded terminal;
    a charge switching element connected to the first output terminal;
    a recovery switching element connected to the second output terminal;
    a resonating inductor connected between both the charge and recovery switching elements and a load for increasing a voltage supplied to the load above a voltage supplied by the power supply thereby providing a single path for charging and recovering energy between the power supply and the load; and
    a plurality of bi-directional switching elements interconnected between each capacitive load and the resonating inductor for selectively enabling each capacitive load and to provide a single switch for both charging each capacitive load and recovering energy from each capacitive load.

* * * * *